US006956274B2

(12) United States Patent
Alie et al.

(10) Patent No.: US 6,956,274 B2
(45) Date of Patent: Oct. 18, 2005

(54) TIW PLATINUM INTERCONNECT AND METHOD OF MAKING THE SAME

(75) Inventors: Susan A. Alie, Stoneham, MA (US); Bruce K. Wachtmann, Concord, MA (US); David S. Kneedler, Middleton, MA (US); Scott Limb, Cambridge, MA (US); Kieran Nunan, Carlisle, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/044,009

(22) Filed: Jan. 11, 2002

(65) Prior Publication Data

US 2003/0132522 A1 Jul. 17, 2003

(51) Int. Cl.[7] .............................................. H01L 27/095
(52) U.S. Cl. ....................... 257/471; 257/472; 257/455; 257/473; 257/474
(58) Field of Search .......................... 257/455, 485–486, 257/471, 369, 383–384, 255, 99, 532, 751, 754, 768, 769–770, 449–457; 438/570, 575, 580–583

(56) References Cited

U.S. PATENT DOCUMENTS

| | | | | | |
|---|---|---|---|---|---|
| 3,831,068 A | * | 8/1974 | Kniepkamp | ................. | 257/473 |
| 3,923,559 A | * | 12/1975 | Sinha | ................. | 148/DIG. 24 |
| 4,358,891 A | * | 11/1982 | Roesner | ....................... | 438/174 |
| 4,400,866 A | * | 8/1983 | Yeh et al. | .................... | 438/571 |
| 4,816,879 A | * | 3/1989 | Ellwanger | ................... | 257/475 |
| 4,946,803 A | * | 8/1990 | Ellwanger | ................... | 438/581 |
| 5,021,840 A | * | 6/1991 | Morris | ....................... | 257/476 |
| 5,166,901 A | * | 11/1992 | Shaw et al. | ................. | 257/476 |
| 5,326,726 A | * | 7/1994 | Tsang et al. | .................. | 438/52 |
| 5,358,826 A | * | 10/1994 | Steitz et al. | ................ | 430/312 |
| 5,417,821 A | * | 5/1995 | Pyke | ......................... | 205/775 |

(Continued)

OTHER PUBLICATIONS

"Development of Flexible Stimulation Devices For A Retina Implant System," Stieglitz et al. *19th International Conference–IEEE/EMBS* Oct. 30–Nov. 2, 1997, Chicago, IL.

"Chemical Vapor Deposition (CVD) of Iridium and Platinum Films and Gas–Phase Chemical Etching of Iridium Thin Films," Xu et al. *Mat. Res. Soc. Symp. Proc.* vol. 541, 1999.

*Primary Examiner*—Long Pham
*Assistant Examiner*—Thao X. Le
(74) *Attorney, Agent, or Firm*—Gauthier & Connors LLP

(57) ABSTRACT

A metallization stack is provided for use as a contact structure in an integrated MEMS device. The metallization stack comprises a titanium-tungsten adhesion and barrier layer formed with a platinum layer formed on top. The platinum feature is formed by sputter etching the platinum in argon, followed by a wet etch in aqua regia using an oxide hardmask. Alternatively, the titanium-tungsten and platinum layers are deposited sequentially and patterned by a single plasma etch process with a photoresist mask.

15 Claims, 9 Drawing Sheets

U.S. PATENT DOCUMENTS

| | | | |
|---|---|---|---|
| 5,561,307 A * | 10/1996 | Mihara et al. | 257/295 |
| 5,583,348 A * | 12/1996 | Sundaram | 257/73 |
| 5,726,484 A * | 3/1998 | Hart et al. | 257/530 |
| 5,918,110 A * | 6/1999 | Abraham-Fuchs et al. | 438/48 |
| 5,955,828 A * | 9/1999 | Sadwick et al. | 313/310 |
| 6,090,678 A * | 7/2000 | Maghsoudnia | 438/382 |
| 6,096,629 A * | 8/2000 | Tsai et al. | 438/570 |
| 6,107,170 A * | 8/2000 | Sathe et al. | 438/583 |
| 6,121,122 A * | 9/2000 | Dunn et al. | 438/583 |
| 6,140,646 A * | 10/2000 | Busta et al. | 250/332 |
| 6,150,199 A * | 11/2000 | Whitten et al. | 438/128 |
| 6,211,560 B1 * | 4/2001 | Jimenez et al. | 257/451 |
| 6,232,150 B1 * | 5/2001 | Lin et al. | 438/119 |
| 6,261,932 B1 * | 7/2001 | Hulfachor | 438/570 |
| 6,262,485 B1 * | 7/2001 | Thakur et al. | 257/757 |
| 6,300,662 B1 * | 10/2001 | Doyle et al. | 257/300 |
| 6,388,789 B1 * | 5/2002 | Bernstein | 359/198 |
| 6,423,598 B1 * | 7/2002 | Takahashi et al. | 257/109 |
| 6,544,674 B2 * | 4/2003 | Tuller et al. | 428/698 |
| 6,570,750 B1 * | 5/2003 | Calcatera et al. | 361/115 |
| 2002/0144548 A1 * | 10/2002 | Cohn et al. | 73/514.16 |
| 2002/0171121 A1 * | 11/2002 | Ozgur | 257/532 |
| 2002/0179921 A1 * | 12/2002 | Cohn | 257/99 |

\* cited by examiner

TIW PLATINUM INTERCONNECT AND METHOD OF MAKING THE SAME

BACKGROUND OF THE INVENTION

The invention relates to the field of interconnects or electrodes for integrated MEMS devices.

Integrated microelectromechanical systems (MEMS) devices are monolithic (single-chip) MEMS devices that contain electrodes with sensing, control or processing circuitry. The production of integrated MEMS devices is based, in large part, upon well-developed techniques in the disciplines of integrated circuit semiconductor manufacturing and photolithography. As such, these devices use metal interconnects/electrodes similar to those for traditional integrated devices. Optical MEMS (such as a micro-mirror for fiber-optic switching), however, require metal interconnects that provide a noble metal surface in the bond pads for epoxy bond. In addition, stress requirements for optical MEMS preclude the use of passivation films over the interconnects. Therefore, the metal of the interconnect must be inert. Similarly, Bio-MEMS devices (such as a DNA analysis chip) require electrodes that are corrosion resistant in the context of exposure to biological substances. These requirements are not met by traditional interconnects/electrodes, such as copper or aluminum interconnects/electrodes produced in standard integrated circuit (IC) processing facilities.

Therefore, the present invention provides a metallization stack utilizing platinum as a noble metal for use in integrated MEMS devices, particularly optical MEMS and Bio-MEMS devices. The present invention also provides a method of patterning platinum.

SUMMARY OF THE INVENTION

In one aspect of the present invention, a metallization stack is provided for use as a contact structure in an integrated MEMS device. The metallization stack comprises a titanium-tungsten layer that operatively contacts an electrically conductive structure in the integrated MEMS device, and a platinum layer formed over the titanium-tungsten layer. In another aspect of the present invention, a method of forming a metallization stack for use as a contact structure in an integrated MEMS device is provided. The method comprises forming a titanium-tungsten layer that operatively contacts an electrically conductive structure in the integrated MEMS device, and forming a platinum layer over the titanium-tungsten layer.

In another aspect of the present invention, an integrated MEMS device comprising a metallization stack having a contact layer of platinum and an adhesion layer of TiW is provided.

In another aspect of the present invention, a method is provided for patterning platinum for fabricating a semiconductor device. Platinum is deposited on a semiconductor substrate. An oxide hardmask is deposited on the platinum. The oxide hardmask is patterned and etched to leave oxide in the areas patterned platinum is to be formed. The exposed platinum is then etched using a combination dry and wet etch, and after the platinum is etched the hardmask is removed.

DETAILED DESCRIPTION OF THE INVENTION

Figure 1:
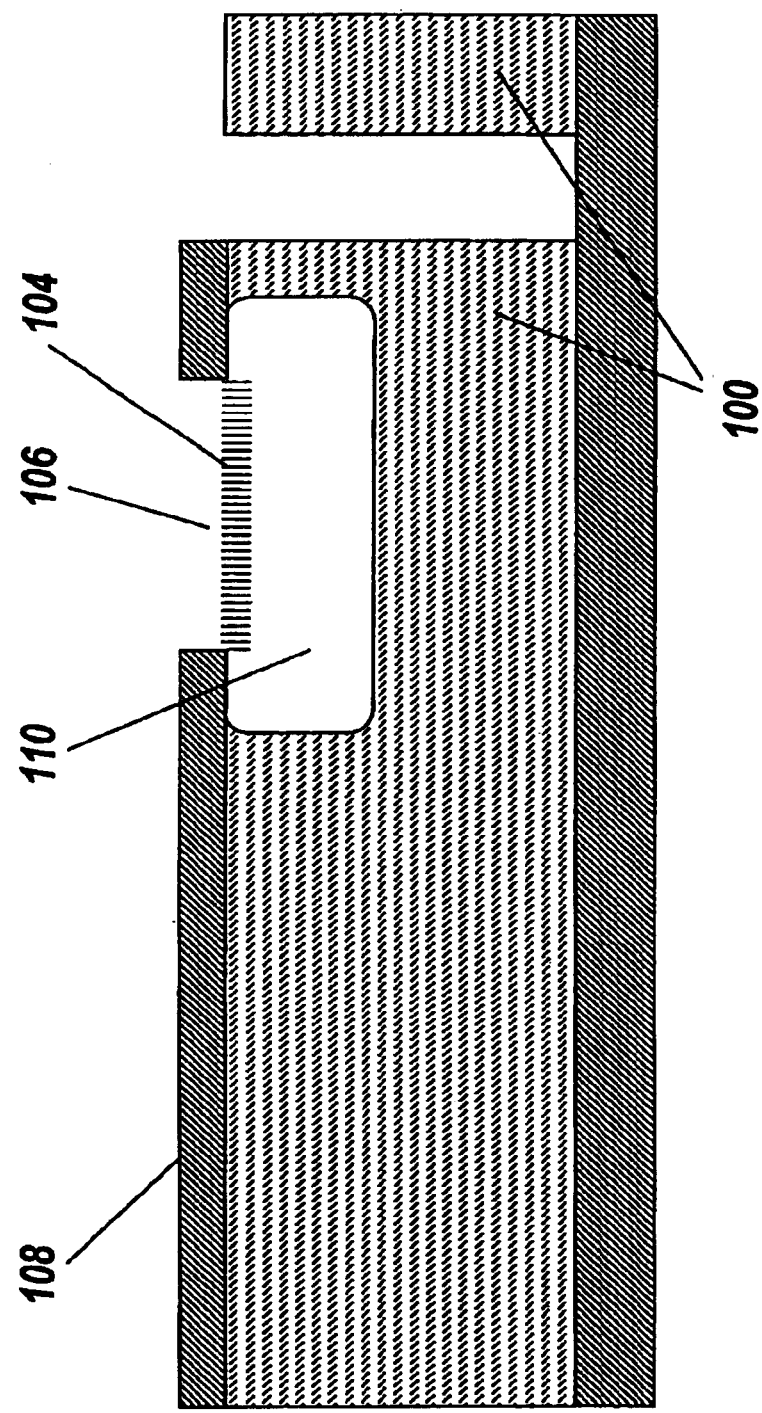
FIG. 1 illustrates a platinum (Pt) metallization stack used to contact active silicon elements that are part of an integrated MEMS device.

A Pt metallization stack is used in integrated MEMS devices so as to provide benefits over prior integrated MEMS interconnect/electrode structures. In one embodiment, the Pt metallization stack is used as an interconnect to contact active silicon elements that are part of an integrated MEMS device. In this case, the Pt is used because stress or bonding requirements require an unpassivated metal or a noble metal for packaging. In another embodiment, the Pt metallization stack is used as an electrode that is monolithically integrated into a standard silicon semiconductor circuit of the integrated MEMS device. The Pt metallization stack is used in this case for MEMS applications that require a corrosive resistant electrode. In addition to the advantages provided by Pt's noble qualities, Pt is particularly advantageous because it is compatible with standard integrated circuit processing facilities. FIG. 1 illustrates a platinum (Pt) metallization stack used to contact active silicon elements that are part of an integrated MEMS device. Optical MEMS devices requiring a noble metal for bonding are exemplary integrated MEMS devices using the Pt metallization stack in this manner. As shown, a silicon substrate 100 has an active silicon element 110 formed in it. A Pt interconnect 108 contacts the active silicon element 110 via a Titanium-tungsten (TiW) adhesion layer 106 and platinum silicide layer 104.

Figure 2:
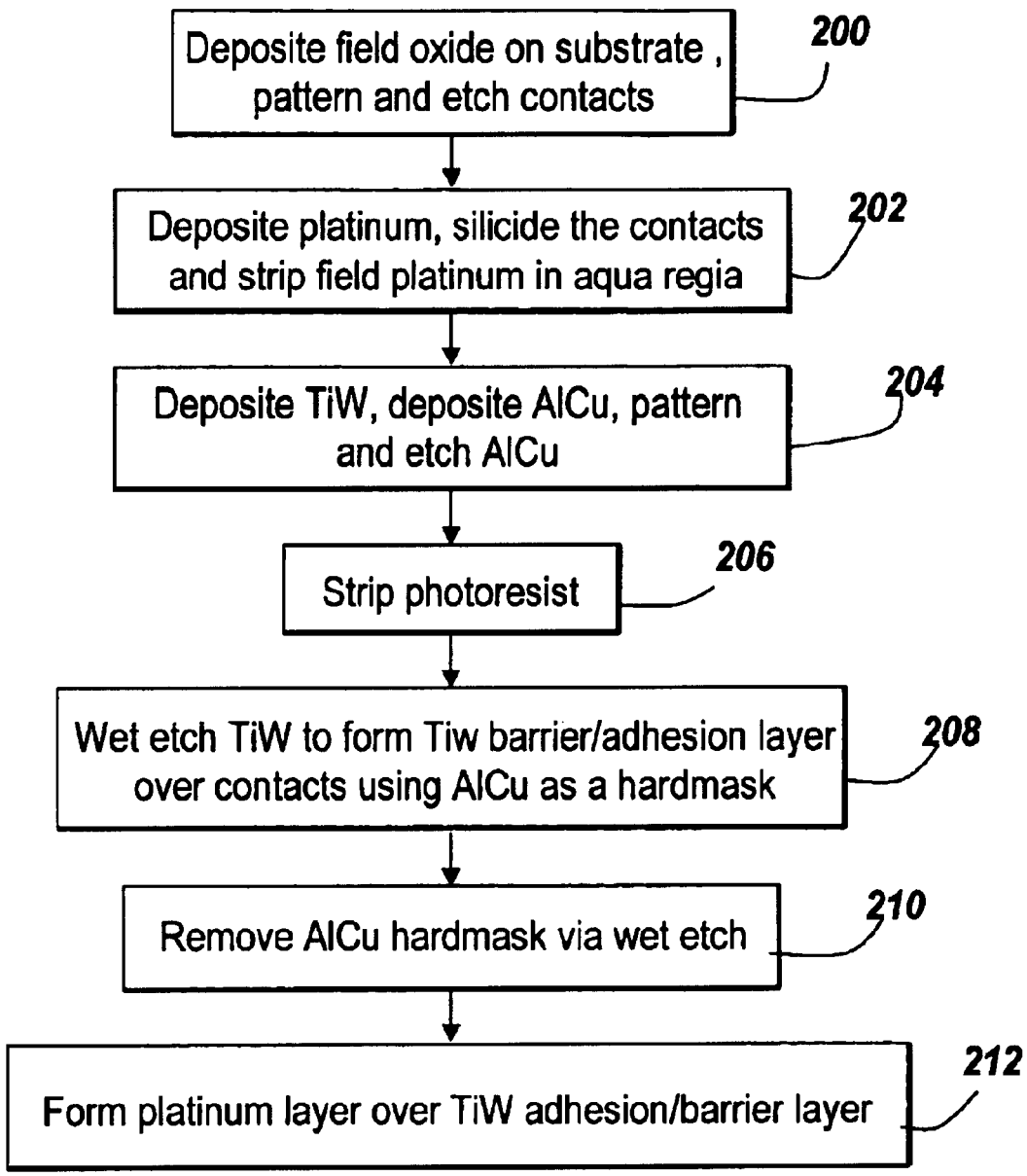
FIG. 2 illustrates a method to form a metallization stack for use as a contact structure in an integrated MEMS device.
Figure 4A:
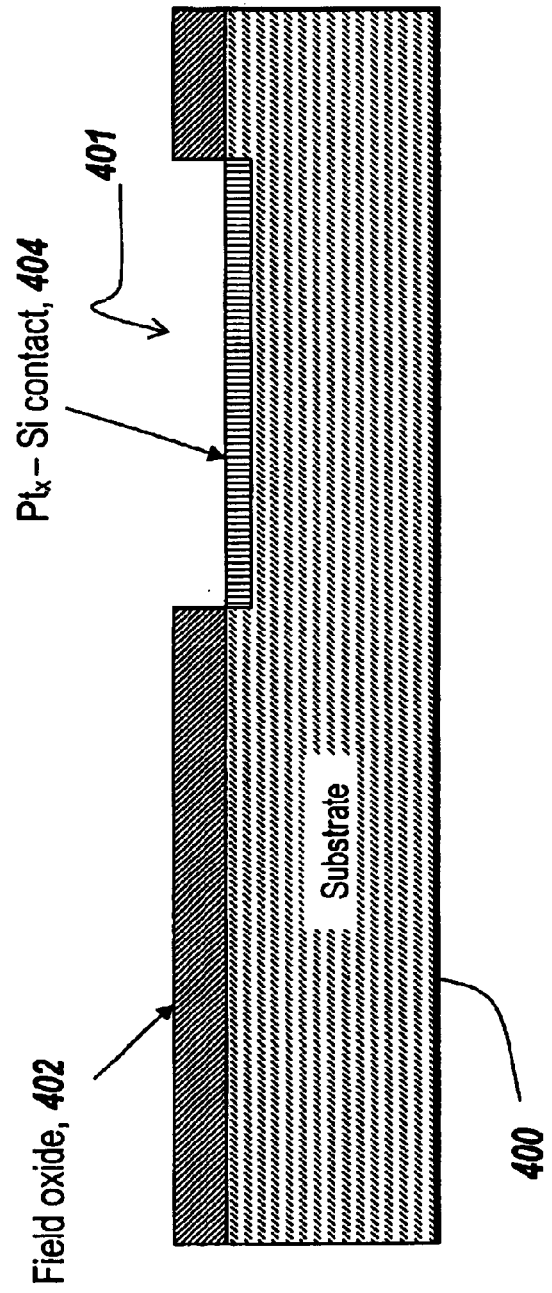
FIGS. 4a–4d illustrate the results of various steps illustrated in FIGS. 1 and 2.

FIG. 2 illustrates a method to form a Pt metallization stack to contact active silicon elements in an integrated MEMS device. A field oxide is deposited on a substrate of silicon, the field oxide is patterned and etched to form holes at the contact area, and the photoresist from this process is stripped 200. Next, a layer of platinum is deposited on the wafer, and a silicide layer is formed from the platinum on the silicon substrate at the bottom of the contact hole to create a $Pt_x$—Si contact and the field platinum is stripped in aqua regia 202. A result of these steps is illustrated in FIG. 4a. As illustrated, a silicon substrate 400 has a field oxide layer 402 on the surface of substrate 400, which has a hole 401 at the contact area. A $Pt_x$—Si contact 404 is formed in the contact area by creating a silicide layer on the silicon substrate at the contact area.

Figure 4B:
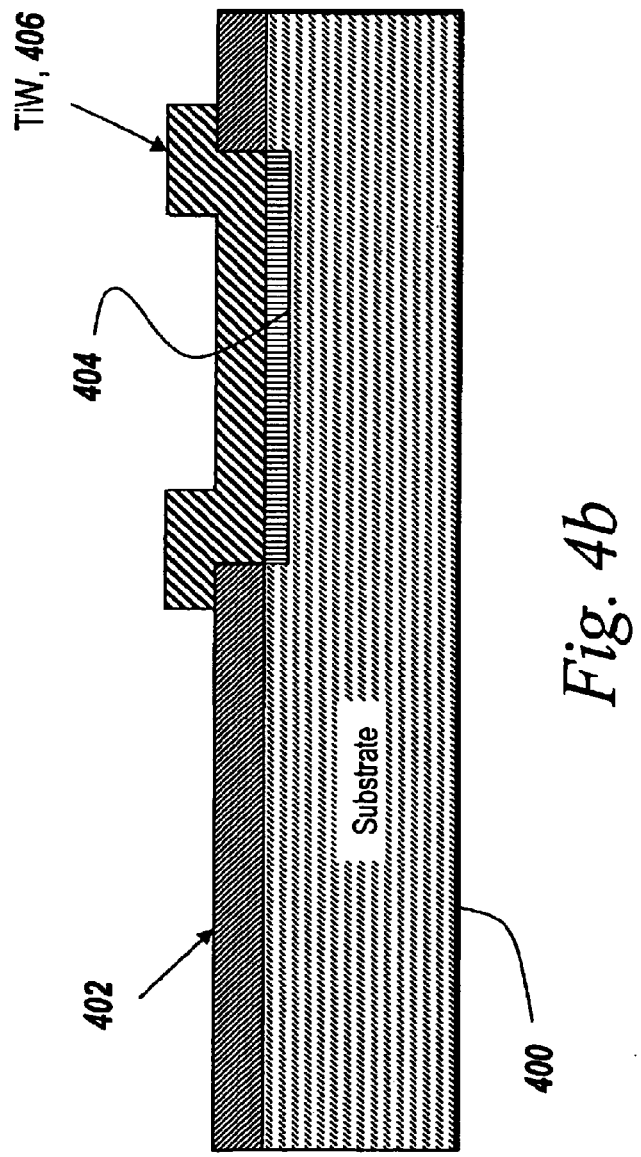

TiW, preferably in the proportion of 10% titanium-90% tungsten, is utilized as an adhesion layer and a barrier layer. This TiW is next deposited on the wafer. A layer of AlCu is deposited on the TiW layer as a hardmask, patterned and etched 204, such that a layer of TiW will be left over the $Pt_x$—Si contact. The photoresist from the etching of the AlCu is then removed 206. Wet etching is performed on the TiW layer to form the TiW adhesion/barrier layer over the $Pt_x$—Si contacts utilizing the AlCu hardmask 208. The AlCu hardmask is then removed via a wet etch process 210. A result of these steps is illustrated in FIG. 4b. As shown, a TiW layer 406 is formed over $Pt_x$—Si contact 404.

Figure 3:
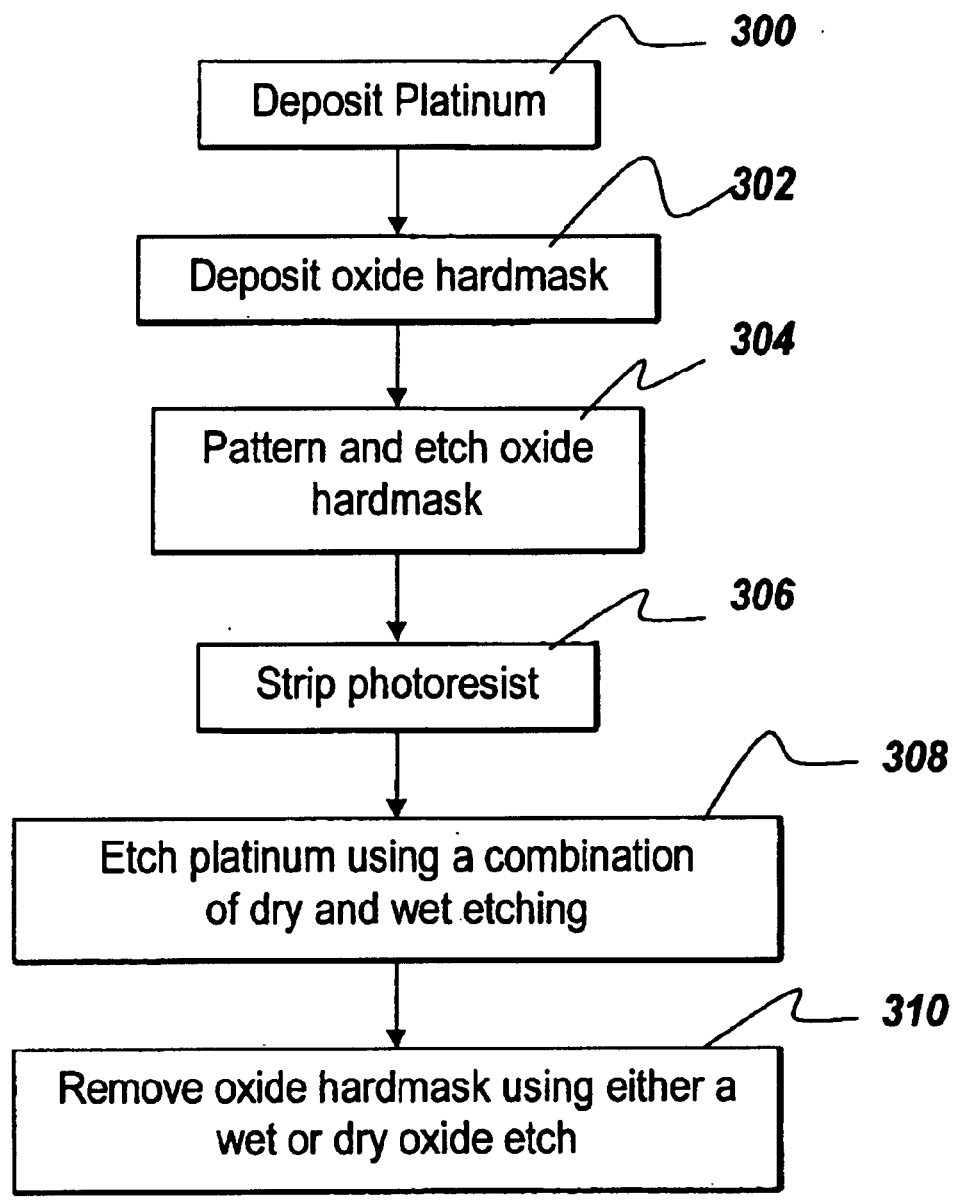
FIG. 3 illustrates a method for patterning platinum.
Figure 4C:
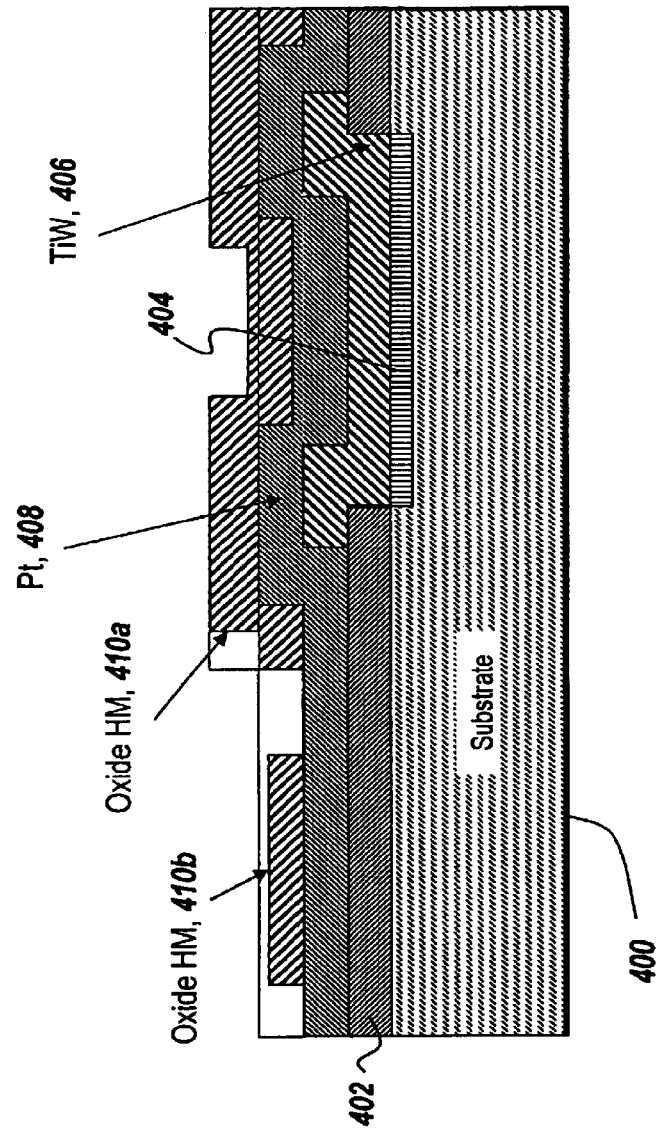

Finally, a platinum layer is formed over the TiW layer 212, preferably utilizing the method illustrated in FIG. 3. Platinum is deposited utilizing any known technique on the wafer 300. An oxide hard mask is then deposited on top of the platinum 302. The oxide hardmask is then patterned and etched utilizing standard photolithography and etch techniques 304. In such techniques, a photoresist is applied to the hardmask and formed into the desired pattern, exposing portions of the hardmask. The entire structure is then exposed to an etchant, which etches away the exposed portions of the hardmask. After the exposed portions have been etched, the photoresist is removed 306. As shown in FIG. 4c, these steps result in deposited platinum 408 covering field oxide 402 and TiW layer 406 along with a patterned oxide hardmask layer. An area of the oxide hardmask 410a covers the area on which the platinum is to be retained to form a platinum layer over TiW layer 406. It should be noted that, preferably, oxide hardmask area 410a is oversized from TiW layer 406 to prevent exposure of TiW layer 406 to a subsequent wet etch in aqua regia.

The platinum is then etched using a combination of dry and wet etching 308 to remove the exposed areas of deposited platinum 408. Once the platinum has been etched, the oxide hardmask is removed using either a dry or wet oxide etch 310.

For the etching of deposited platinum 408, first the dry etching is performed by sputter etching in, preferably, Argon. As is well known in the art, sputter etching utilizes ionized particles of a charged gas plasma to bombard the surface of a substrate, in this case the platinum, to etch away or "sputter" substrate particles from the surface of the substrate. In sputter etching, a plasma gas, in the present case preferably argon, is typically introduced into the processing space of a processing chamber. The substrate to be etched is electrically charged or biased. Energy is coupled to the gas, which ionizes the gas particles so that they acquire a net charge that is of opposite polarity to the charge of the substrate. The ionized particles of the gas collectively form a gas plasma or plasma cloud. The charge of the ionized particles of the plasma is opposite that of the substrate, and therefore, the ionized particles in the plasma are attracted to the substrate surface. As a result of this attraction, the ionized particles bombard the surface and dislodge material particles to etch the substrate. Once this is completed, the etching of the platinum is continued by a wet etch of the platinum in aqua regia. As is well known, wet etching comprises immersing the structure in a liquid bath of a chemical etchant, which is preferably aqua regia.

Figure 4D:
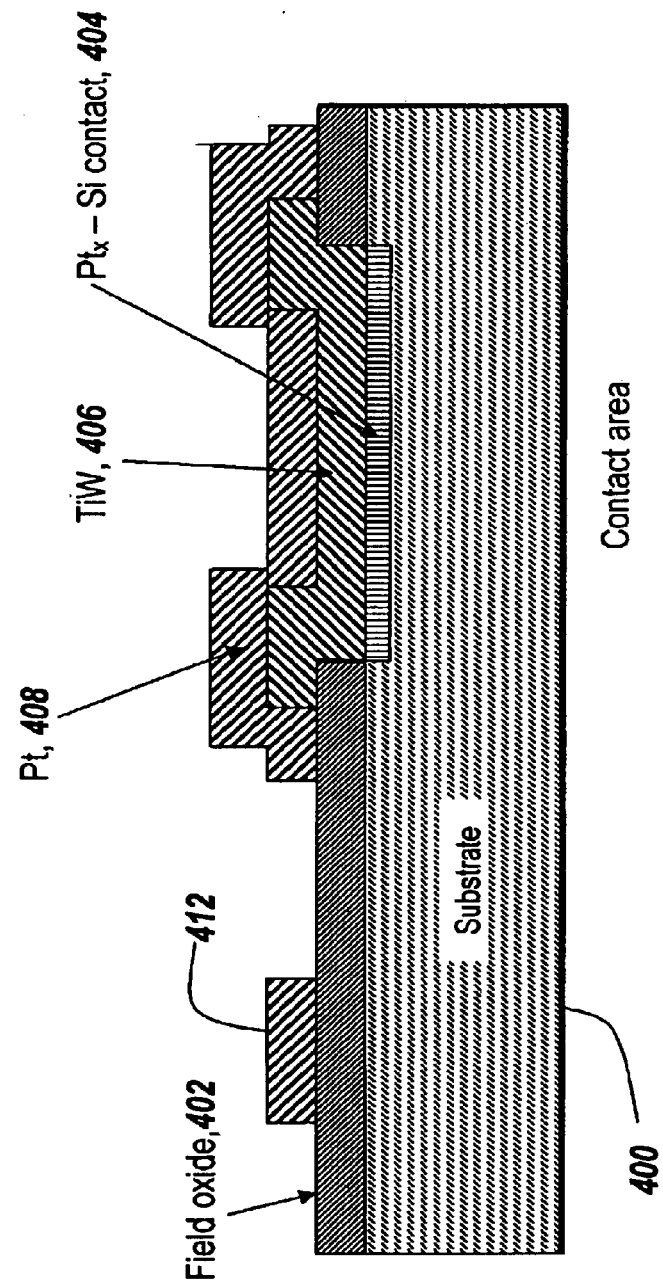

The final contact structure from these steps is illustrated in FIG. 4d. A platinum layer 408 is formed, under which is TiW adhesion/barrier 406 layer formed over $Pt_x$—Si contact area 404.

When platinum layer 408 is a portion of platinum wiring (interconnect) formed on field oxide layer 402, or when platinum wiring is formed on field oxide layer 402 in addition to the contact structure, the platinum patterning method is preferably utilized to form both platinum layer 408 and the platinum wiring simultaneously. This is additionally illustrated in FIGS. 4c and 4d. As shown in FIG. 4c, in addition to oxide hardmask area 410a, an oxide hardmask area 410b covers deposited platinum 408 in an area where platinum wiring is to be formed. After the etching of the deposited platinum 408 and removal of the patterned oxide hardmask, platinum-wiring 412 is left on field oxide layer 402, as shown in FIG. 4d.

Figure 5:
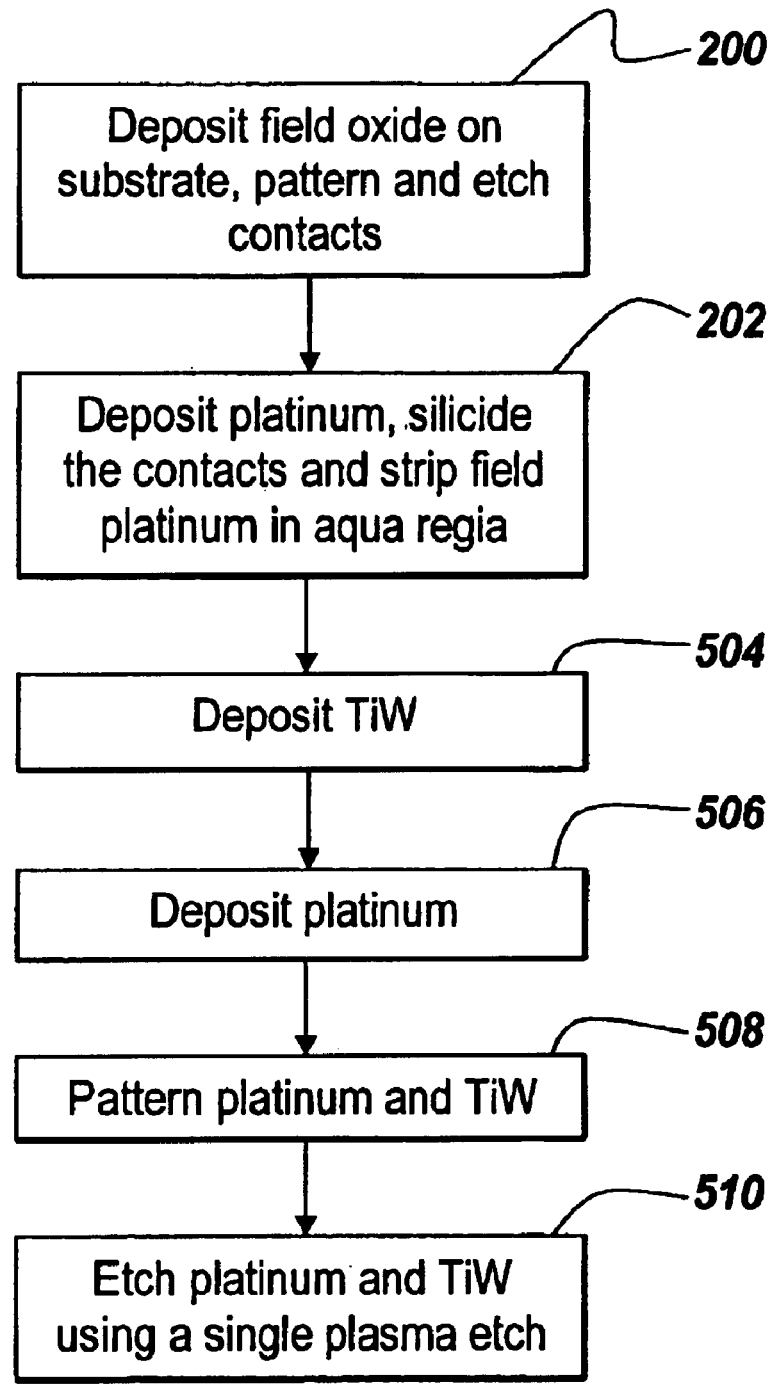
FIG. 5 illustrates an alternate method to form a metallization stack for use as a contact structure in an integrated MEMS device.

FIG. 5 illustrates an alternate method to form the Pt metallization stack to contact active silicon elements in an integrated MEMS device. In this alternative, TiW layer 406 and Pt layer 408 are deposited sequentially and patterned simultaneously by plasma etch, using a photoresist as a mask. As shown, the process is the same as that of FIG. 1 up to step 102. After step 102, TiW is deposited on the surface of the substrate 504. Platinum is next deposited on top of the TiW 506. The platinum and TiW are then patterned using a photoresist mask 508 and simultaneously etched using a single plasma etch 510.

Figure 6:
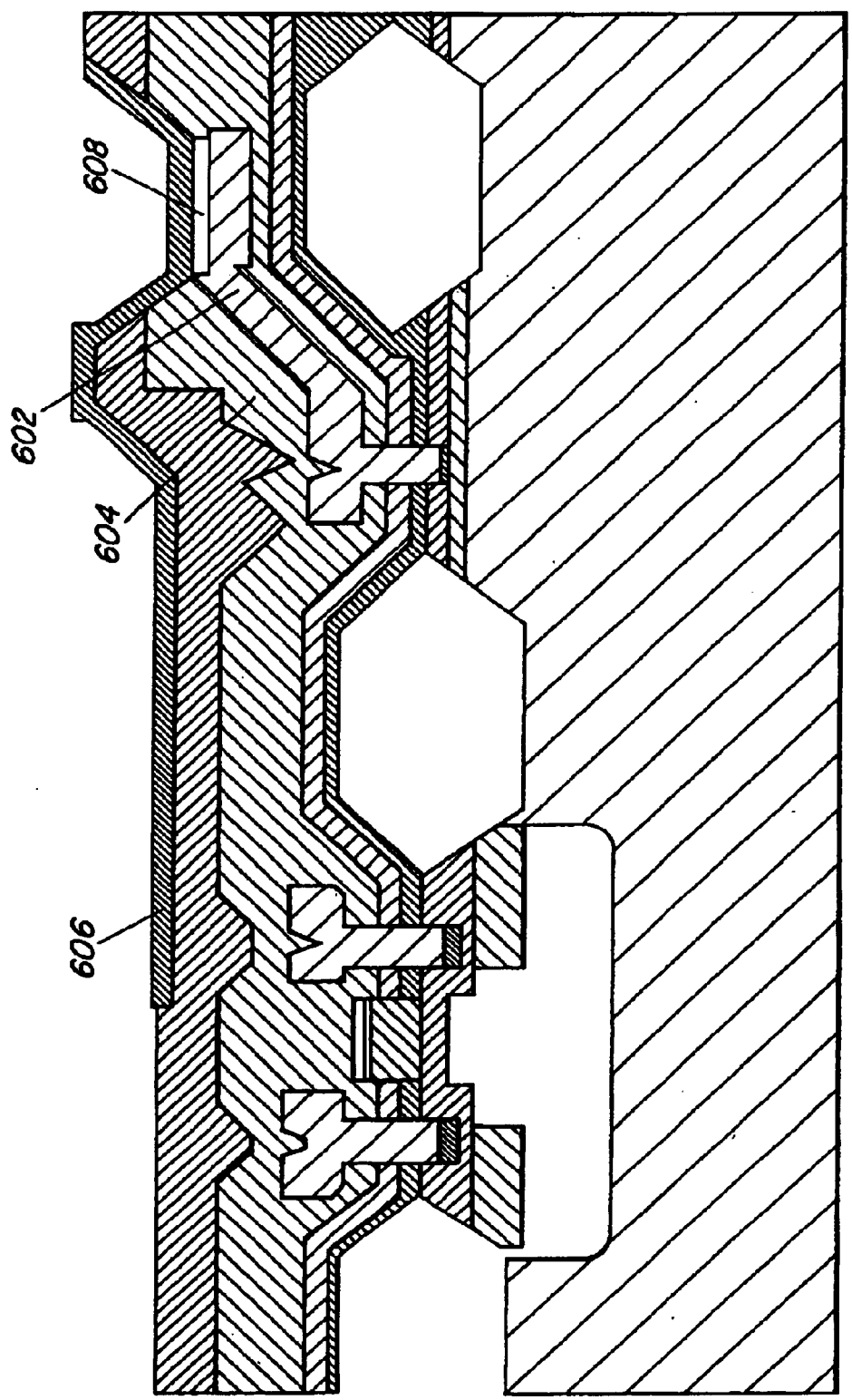
FIG. 6 illustrates the Pt metallization stack used as a MEMS electrode that has been monolithically integrated into a standard silicon semiconductor circuit.

FIG. 6 illustrates the Pt metallization stack used as a MEMS electrode that has been monolithically integrated into a standard silicon semiconductor circuit. Bio-MEMS devices used to handle corrosive or harsh fluids are exemplary integrated MEMS devices using the Pt metallization stack in this manner. As shown, an active silicon device 600 has conventional integrated circuit interconnections 602 with a passivation layer 604. Pt electrode 606 contacts conventional interconnect 602 via TiW adhesion layer 608. When used in this application, the metallization stack is formed by either the method described in FIGS. 2 or 5, absent steps 202 and 204 because the platinum silicide is not used to contact conventional interconnect 602.

Although the present invention has been shown and described with respect to several preferred embodiments thereof, various changes, omissions and additions to the form and detail thereof, may be made therein, without departing from the spirit and scope of the invention. For example, the platinum patterning technique is not limited to use with the metallization scheme described herein, but rather is appropriate for the formation of any patterned platinum features required for the fabrication of a semiconductor device. In addition, while the metallization scheme of the present invention is particularly advantageous for optical MEMS devices and Bio-MEMS devices, it should not be construed as limited thereto, but rather it is appropriate for integrated MEMS devices in which a noble metal is advantageous for interconnects/electrodes.

What is claimed is:

1. A metallization stack in an integrated MEMS device, the metallization stack comprising:
    a substrate having an electrically conductive structure;
    a field oxide, having a contact hole therein, formed over said substrate;
    a silicide layer formed in said contact hole of said field oxide;
    a titanium-tungsten layer, formed directly on said silicide layer, to operatively contact said electrically conductive structure in said substrate; and
    an integral platinum layer;
    said integral platinum layer having a first portion formed directly on said titanium-tungsten layer;
    said integral platinum layer having a second portion formed directly on said field oxide;
    said silicide layer, said titanium-tungsten layer, and said integral platinum layer, together, forming an electrical connection to said electrically conductive structure.

2. The metallization stack of claim 1, wherein said electrically conductive structure is an active silicon element.

3. The metallization stack of claim 2, wherein said contact hole exposes a portion of a surface of said substrate at a bottom of said contact hole and said suicide layer is formed only on the exposed portion of the surface of said substrate.

4. The metallization stack of claim 1, wherein the integrated MEMS device is an optical MEMS.

5. The metallization stack of claim 1, wherein the integrated MEMS device is a Bio-MEMS device.

6. The metallization stack of claim 5, wherein said integral platinum layer forms a corrosive resistant electrode.

7. The metallization stack of claim 6, wherein said electrically conductive structure is an interconnect of the Bio-MEMS device.

8. The metallization stack of claim 1, wherein said suicide layer is a platinum suicide layer.

9. A metallization stack in an integrated MEMS device, the metallization stack comprising:

a substrate having an electrically conductive structure;

a field oxide formed over said substrate;

a suicide layer formed on said field oxide;

a titanium-tungsten layer, formed directly on said silicide layer, to operatively contact said electrically conductive structure in said substrate; and an integral platinum layer;

said integral platinum layer having a first portion formed directly on said titanium-tungsten layer;

said integral platinum layer having a second portion formed directly on said field oxide.

10. The metallization stack of claim 9, wherein said electrically conductive structure is an active silicon element.

11. The metallization stack of claim 9, wherein the integrated MEMS device is an optical MEMS.

12. The metallization stack of claim 9, wherein the integrated MEMS device is a Bio-MEMS device.

13. The metallization stack of claim 12, wherein said integral platinum layer forms a corrosive resistant electrode.

14. The metallization stack of claim 13, wherein said electrically conductive structure is an interconnect of the Bio-MEMS device.

15. The metallization stack of claim 9, wherein said silicide layer is a platinum silicide layer.

* * * * *